United States Patent

Saito et al.

[11] Patent Number: 6,147,866
[45] Date of Patent: Nov. 14, 2000

[54] ELECTRONIC DEVICE

[75] Inventors: Yoshio Saito; Satoshi Urabe; Jiro Kikuchi, all of Fukushima-ken; Nobuyuki Suzuki, Miyagi-ken; Yoshikiyo Watanabe, Fukushima-ken, all of Japan

[73] Assignee: Alps Electric Co., Ltd., Tokyo, Japan

[21] Appl. No.: 09/336,292

[22] Filed: Jun. 21, 1999

[30] Foreign Application Priority Data

| Jul. 2, 1998 | [JP] | Japan | 10-187839 |
| Jul. 10, 1998 | [JP] | Japan | 10-195703 |
| Jul. 21, 1998 | [JP] | Japan | 10-204631 |

[51] Int. Cl.$^7$ .................................................. H05K 7/20
[52] U.S. Cl. .......................................... 361/704; 361/719
[58] Field of Search .................................... 361/704, 705, 361/707, 720, 710–713, 717–719, 784, 785, 788; 257/707, 713, 718, 719; 165/80.3, 185; 174/16.3, 252

[56] References Cited

U.S. PATENT DOCUMENTS

| 5,703,753 | 12/1997 | Mok . |
| 5,802,707 | 9/1998 | Brownell . |
| 5,831,333 | 11/1998 | Malladi . |
| 6,018,465 | 1/2000 | Borkar . |
| 6,043,981 | 3/2000 | Markow . |

FOREIGN PATENT DOCUMENTS

| 9-213852 | 8/1997 | Japan . |
| 9-246765 | 9/1997 | Japan . |

*Primary Examiner*—Gerald Tolin
*Attorney, Agent, or Firm*—Brinks Hofer Gilson & Lione

[57] ABSTRACT

According to the electronic device of the invention, the convex parts formed on the case is inserted into the engagement holes provided on the thermal conduction member, and the front ends of the convex parts are caulked to eliminate the plays. Further, the tongue-form pieces are formed on each of the two sides parallel to each other, the clasps are formed upright on the case, and the tongue-form pieces are hooked by the lower sides of the clasps. Further, the two sides where the tongue-form pieces of the thermal conduction member are formed are provided with slits that make it easy to deflect the tongue-form pieces, which facilitates the work to hook by slanting the upper sides of the clasps on the case, and further eliminates the plays.

7 Claims, 6 Drawing Sheets

ELECTRONIC DEVICE

BACKGROUND OF THE INVENTION

1. Field of the Invention

The present invention relates to an electronic device such as a transmitter receiver unit which is used for a portable telephone, or the like.

2. Description of the Related Art

A conventional electronic device will be described with reference to FIG. 6 through FIG. 8, in which FIG. 6 is a perspective view of the conventional electronic device, FIG. 7 is an exploded perspective view of a part of the same, and FIG. 8 is a sectional view of a major part of the same.

In these drawings, a case 41 formed of a plastic material contains a bottom wall 41a, four side walls 41b, an opening 41c that is open upward facing to the bottom wall 41a, a large through-hole 41d formed on the bottom wall 41a, a through-hole 41e for taking out cables, L-letter shaped pawls 41f provided on several points around the large through-hole 41d, which have recesses facing the large through-hole 41d, ears 41g flush with the bottom wall 41a, provided on the corners outside the side walls 41b, through-holes 41h formed on the centers of the ears 41g, projections 41k projected inward on the side walls 41b, female screws 41m provided on the centers of the projections 41k, a metal film 41n overlaid on all the surfaces of the case 41 by plating or the like.

A rectangular thermal conduction member 42 made of a metal plate comprises a flat portion 42a, tongue pieces 42d cut and raised upward by cutting out parts of the flat portion 42a, and a plurality of through-holes 43 provided on the flat portion 42a.

The thermal conduction member 42 is housed inside the case 41 with the cut and raised tongue pieces 42d directing upward, and is attached to the case 41 by hooking the periphery of the flat portion 42a inside the L-letter shaped pawls 41f, so that the flat portion 42a closes the large through-hole 41d of the case 41.

There are a vertical difference of dimension between the height (inner dimension) of the recess of the pawl 41f and the thickness of the thermal conduction member 42, and a lateral difference of dimension between the two pawls 41f facing each other across the large through-hole 41d and the width of the thermal conduction member 42. Accordingly, the thermal conduction member 42 has plays against the case 41 in the vertical and lateral directions.

A printed circuit board 44 contains through-holes 48 and conductive patterns (not illustrated). The printed circuit board 44 has a connector 45 for connecting a cable and heating components 46 with higher calorific values, etc., mounted on a lower side 44a thereof, and electronic components 47 with lower calorific values, etc., mounted on a upper side 44b.

A box-shaped metal cover 49 made of a metal plate has the lower side opened, and a plurality of through-holes 50 on the upper side. This metal cover 49 is attached to the printed circuit board 44 so as to overlay the electronic components 47 on the upper side 44b, which electrically shields the electronic components 47 mounted on the upper side 44b.

The printed circuit board 44 is mounted on the case 41 in such a manner that the lower side 44a with the heating components 46 mounted thereon faces the bottom wall 41a of the case 41 to close the opening 41c, and is attached to the case 41 by screwing male screws 51 put through the through-holes 48 of the printed circuit board 44 into the female screws 41m provided on the projections 41k of the case 41.

In a state that the printed circuit board 44 is attached to the case 41, the thermal conduction member 42 faces to an area including the heating components 46 on the lower side 44a of the printed circuit board 44, and the tongues 42d of the thermal conduction member 42 are in contact with the surfaces of the heating components 46 mounted on the lower side 44a of the printed circuit board 44.

The case 41 with the printed circuit board 44 and the thermal conduction member 42 attached thereon is mounted on the surface of a mother board 52 where conductive patterns 52a are formed, and it is fastened to the mother board 52 by screwing male screws 53 put through the through-holes 41h formed on the ears 41g of the case 41 into female screws 52b made on the mother board 52.

In the electronic device having the aforementioned construction, the heat generated by the heating components 46 diffuses into the whole thermal conductive member 42 through the tongue pieces 42d being in contact with the surface of the heating components 46, and radiates from the thermal conduction member 42.

However, in the conventional electronic device, since the thermal conduction member 42 is attached to be hooked by the pawls 41f of the case 41, there is play between the pawls 41f and the thermal conduction member 42. Accordingly, the electronic device emits play noises due to vibrations of the thermal conduction member 42 when receiving vibrations and impacts from outside, or breaks the heating components 46 by the friction between the tongue pieces 42d and the surface of the heating components 46, which is a problem.

SUMMERY OF THE INVENTION

The present invention has been made to solve the forgoing problem. According to one aspect of the invention, the electronic device comprises: a printed circuit board; heating components mounted on the printed circuit board; a case which the printed circuit board is attached to and the heating components are housed in; a thermal conduction member made of a metal; and a mother board having conductive patterns formed on the surface of the case. In this construction, the thermal conduction member is attached to the case in contact with both of the conductive patterns on the mother board and the heating components, and a heat generated from the heating components is led to the conductive patterns on the mother board through the thermal conduction member.

Further, the foregoing electronic device may further comprise an elastic sheet having an excellent thermal conductivity between the thermal conduction member and the conductive patterns on the mother board. With this construction, the heat generated from the heating components is led to the conductive patterns on the mother board through the thermal conduction member and the sheet.

Further, this sheet may be bonded to a surface of the thermal conduction member, or to a surface of the conductive patterns on the mother board.

According to another aspect of the invention, the case of the electronic device is made of a resin, and contains a plurality of convex parts. The thermal conduction member has a plurality of engagement holes into which the convex parts on the case can be inserted, the convex parts formed on the case are inserted into the engagement holes, and the thermal conduction member is fastened to the case by caulking front ends of the convex parts projected out from the engagement holes.

Further, the case of the electronic device is made of a resin, on which a pair of clasps resembling L letter are formed upright, and the thermal conduction member is fastened to the case in such a manner that front ends of the thermal conduction member are hooked by the clasps formed on the case.

Further, the thermal conduction member of the electronic device contains tongue-form pieces between two cutout portions formed on each of two sides parallel to each other of the thermal conduction member, the upper sides of the clasps on the case are made slant, and the tongue-form pieces are hooked by the lower sides of the clasps formed on the case. The thermal conduction member contains slits formed along each of the two sides, and owing to the slits, the tongue-form pieces are made easy to deflect in the thickness direction.

DETAILED DESCRIPTION OF THE PREFERRED EMBODIMENT

Figure 1:
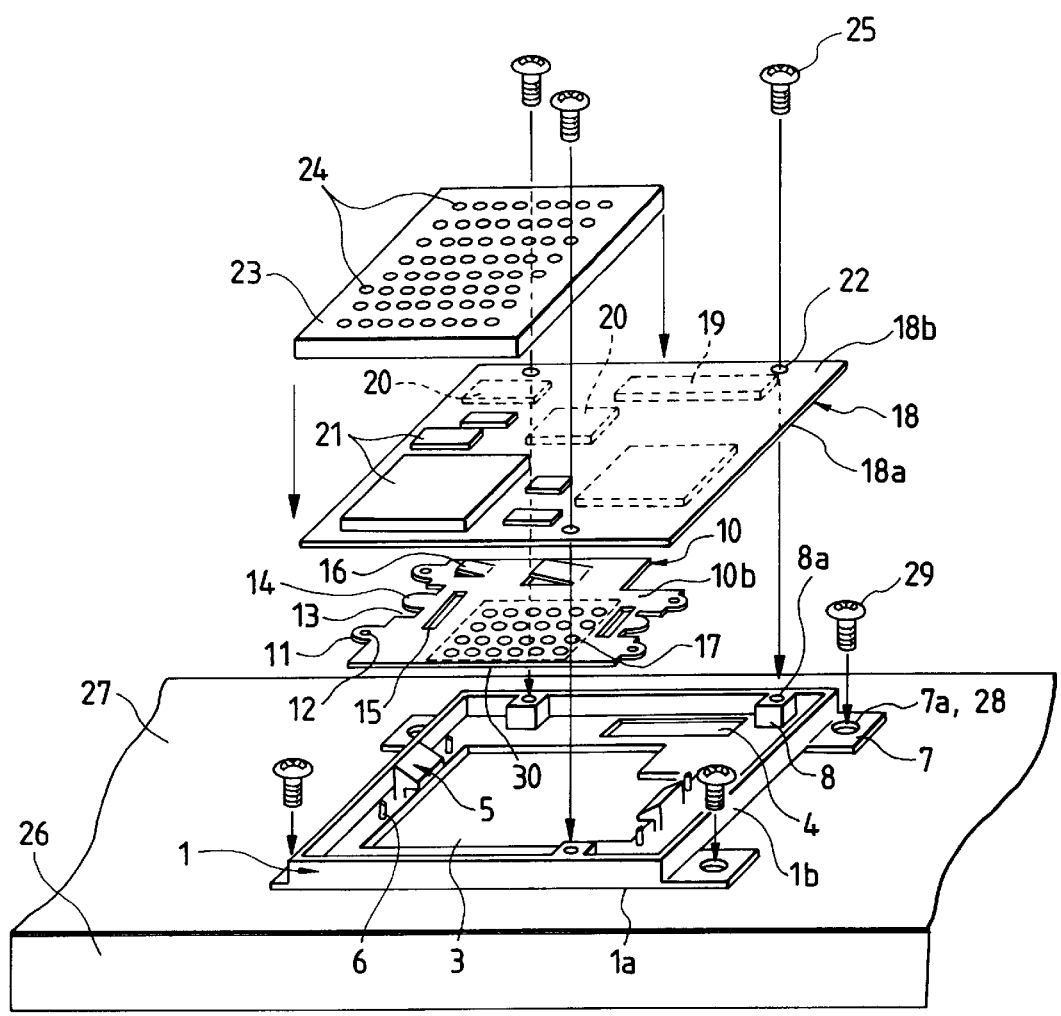
FIG. 1 is an exploded perspective view of a part of an electronic device relating to the invention.
Figure 2:
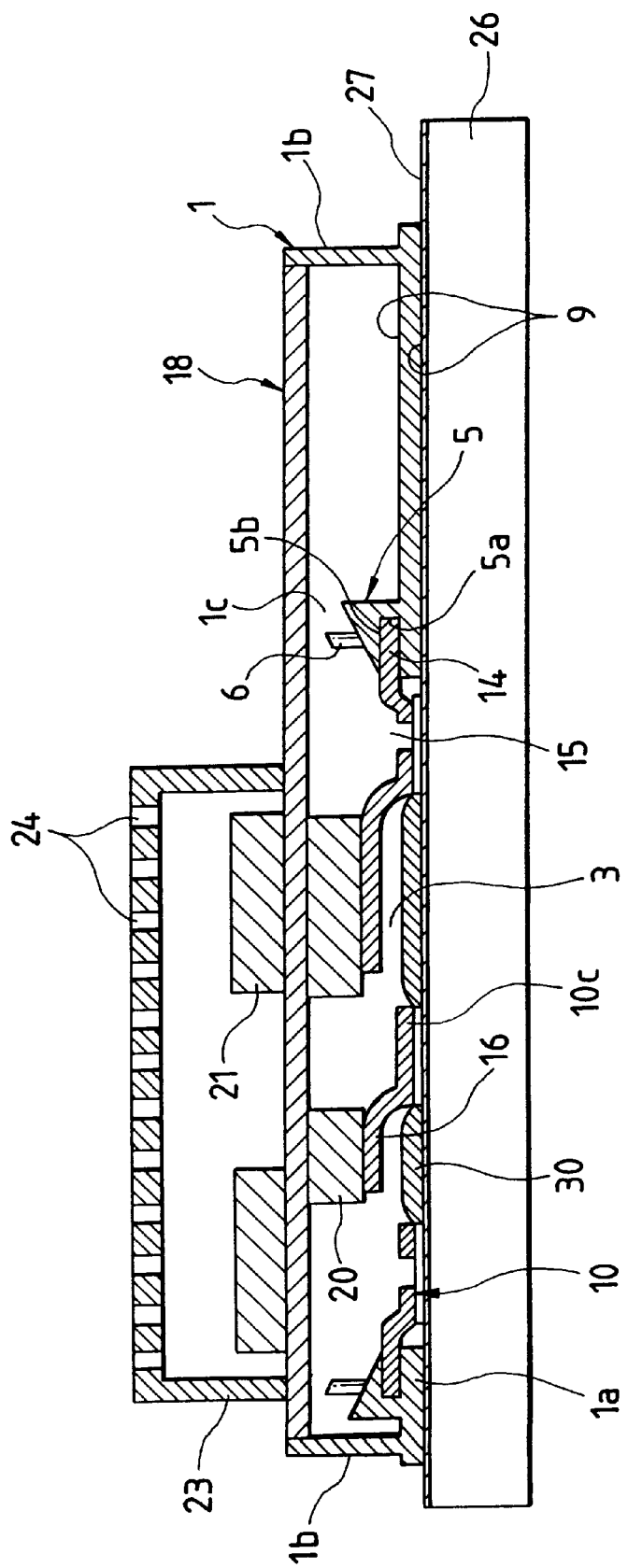
FIG. 2 is a sectional view of a major part of the electronic device relating to the invention.
Figure 3:
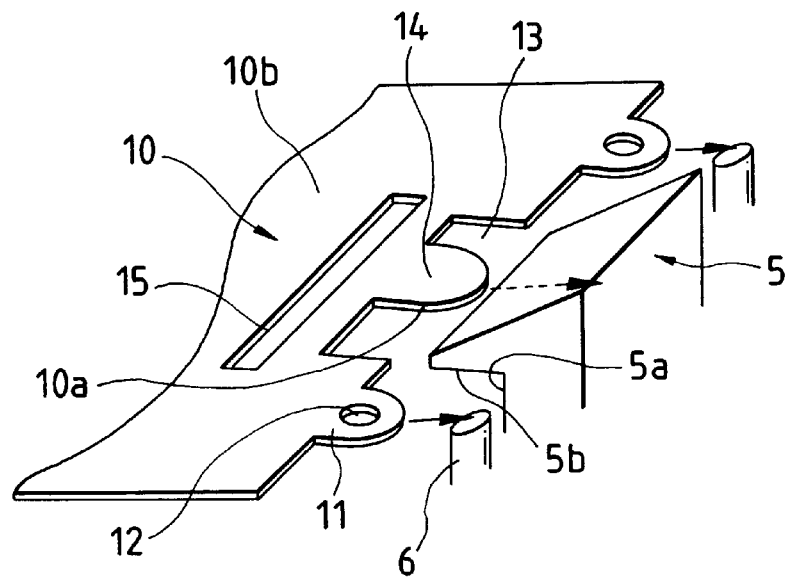
FIG. 3 is a chart to illustrate the method of attaching the thermal conduction member to the case, in the electronic device of the invention.
Figure 4:
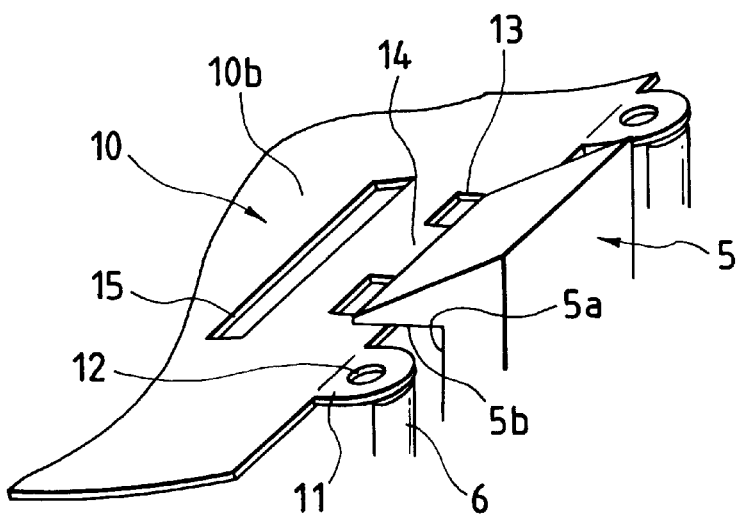
FIG. 4 is a chart to illustrate the method of attaching the thermal conduction member to the case, in the electronic device of the invention.
Figure 5:
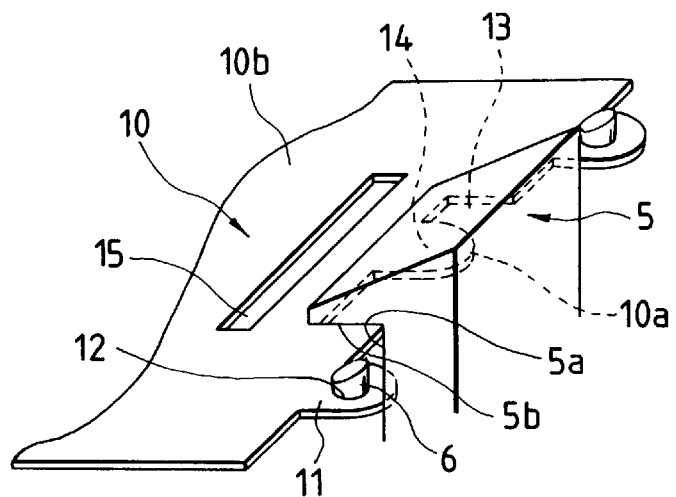
FIG. 5 is a chart to illustrate the method of attaching the thermal conduction member to the case, in the electronic device of the invention.
Figure 6:
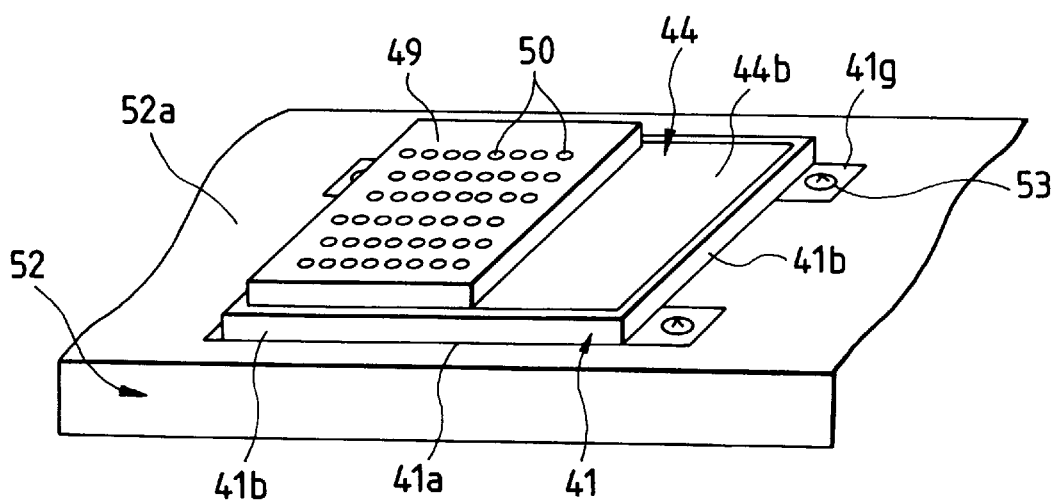
FIG. 6 is a perspective view of a conventional electronic device.
Figure 7:
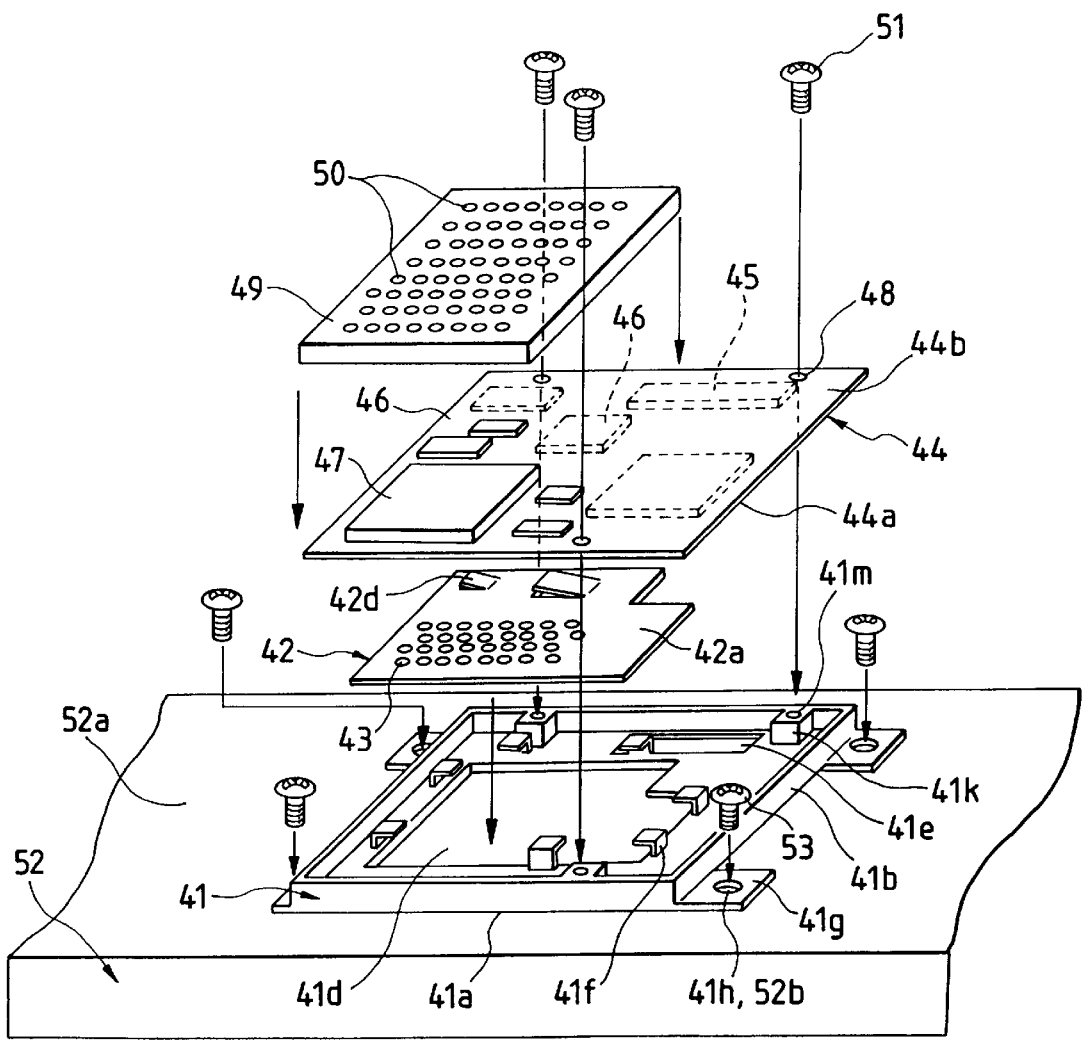
FIG. 7 is an exploded perspective view of a part of the conventional electronic device.
Figure 8:
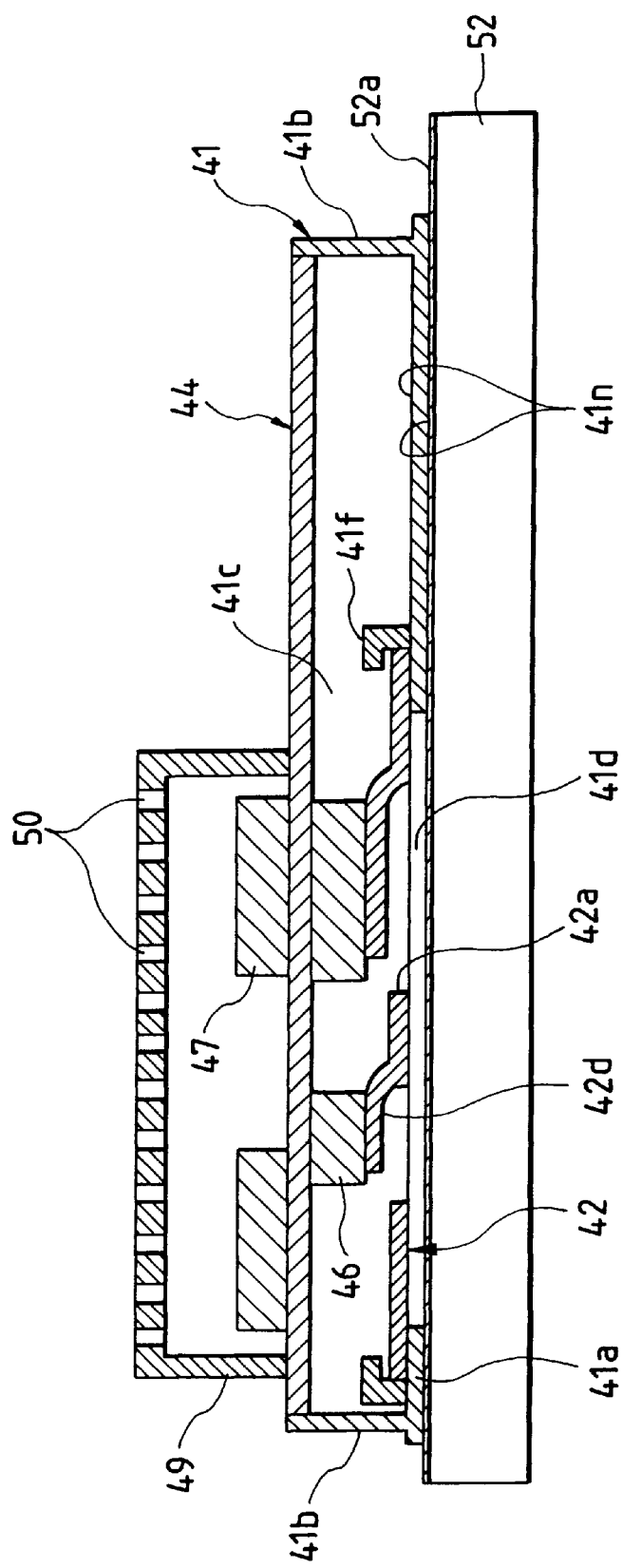
FIG. 8 is a sectional view of a major part of the conventional electronic device.

The embodiment of the electronic device of the invention will be described with reference to FIG. 1 through FIG. 5, in which FIG. 1 is an exploded perspective view of an electronic device of the invention, FIG. 2 is a sectional view of a major part of the electronic device, and FIG. 3 through FIG. 5 relate to the electronic device and illustrate the method of attaching the thermal conduction member to the case.

In these drawings, a case 1 formed of a plastic material contains a bottom wall 1a, four side walls 1b, an opening 1c that is open upward facing to the bottom wall 1a, a large rectangular through-hole 3 formed on the bottom wall 1a, and a through-hole 4 for taking out cables. And, there are clasps 5 and convex parts 6 formed on an outer periphery of the large through-hole 3. The clasp 5 is made in an L-letter shape, which has a side part 5a perpendicular to the bottom wall 1a and a hook part 5b formed on the front end. The convex part 6 is perpendicular to the bottom wall 1a, which is formed of a cylinder with such a slope that the height of the cylinder decreases toward the large through-hole 3. The clasps 5 are disposed so as to face each other across the large through-hole 3, and the convex parts 6 are disposed on both sides of the clasp 5.

Further, the case 1 contains ears 7 flush with the bottom wall 1a, which are provided on the corners outside the side walls 1b, through-holes 7a formed on the centers of the ears 7, projections 8 projected upward on the side walls 1b, female screws 8a provided on the centers of the projections 8, a metal film 9 overlaid on all the surfaces of the case 1 by plating or the like.

A rectangular thermal conduction member 10 made of a metal plate comprises projecting pieces 11 projected outward from a side edge 10a, which are placed with a certain spacing, engagement holes 12 formed on each of the projecting pieces 11, cutout portions 13 formed on the side edge 10a between the projecting pieces 11, a tongue-form piece 14 formed between the two cutout portions 13, a slit 15 formed on the conductive member near the cutout portions 13. On both the parallel sides of the thermal conduction member 10 are disposed at least a pair of the projecting pieces 11, the engagement holes 12 formed on the projecting pieces 11, and the cutout portions 13 and the tongue-form pieces 14 which are formed between the two projecting pieces 11. The thermal conduction member 10 further comprises tongue pieces 16 cut and raised upward in parts of a flat portion 10b, and a plurality of through-holes 17 formed on the flat portion 10b. The through-holes 17 reduce the weight of the thermal conduction member 10. Further, the thermal conduction member 10 comprises a swelling portion 10c projected downward in a shape that coincides with the large through-hole 3 of the case 1.

Next, the method of attaching the thermal conduction member 10 to the case 1 will be described, referring to FIG. 3 through FIG. 5.

The thermal conduction member 10 is housed in the case 1 with the tongue pieces 16 facing upward (see FIG. 1). As shown in FIG. 3, the clasps 5 formed on the case 1 are engaged in the cutout portions 13 of the thermal conduction member 10. Here, as shown in FIG. 4, the thermal conduction member 10 is fit in such that the tongue-form pieces 14 are hooked in the hook parts 5b of the clasps 5. At the same time, the projecting pieces 11 are guided by the convex parts 6, so that the convex parts 6 fit in the engagement holes 12 formed on the projecting pieces 11. As shown in FIG. 5, the tongue-form pieces 14 of the thermal conduction member 10 are pressed down at the front ends thereof by the side parts 5a of the clasps 5, and the convex parts 6 of the case 1 are engaged in the engagement holes 12 of the thermal conduction member 10, whereby the thermal conduction member 10 is attached to the case 1 so as to seal the large through-hole 3.

When the thermal conduction member 10 is attached to the case 1, in a state that the tongue-form pieces 14 are hooked by the clasps 5, the front ends of the tongue-form pieces 14 are pressed by the side parts 5a of the clasps 5, and the convex parts 6 on the case 1 are inserted into the engagement holes 12 of the thermal conduction member 10, so that the thermal conduction member 10 is joined with the case 1 without play.

Further, the thermal conduction member 10 is pressed to be fastened to the case 1 by heating to collapse (caulking) the front ends of the convex parts 6 coming out of the engagement holes 12.

When the thermal conduction member 10 is attached to the case 1, as above, the swelling portion 10c of the flat portion 10b of the thermal conduction member 10, formed to coincide with the shape of the large through-hole 3 of the case 1, appears downward from the large through-hole 3, and is flush with or projected from the bottom wall 1a of the case 1.

An elastic sheet 30 having an excellent thermal conductivity is made of a polyimide film, for example, on both sides of which is applied an acrylic adhesive. The elastic sheet 30 is glued to be attached to the surface of the thermal conduction member 10, which is exposed from the large though-hole 3 of the case 1.

A printed circuit board 18 contains through-holes 22 and conductive patterns (not illustrated). The printed circuit board 18 has a connector 19 for connecting cables and heating components 20 with higher calorific values, etc., mounted on a lower side 18a thereof, and electronic components 21 with lower calorific values, etc., mounted on a upper side 18b.

A box-shaped metal cover 23 made of a metal plate has the lower side opened, and a plurality of through-holes 24 on the upper side. This metal cover 23 is attached to the printed circuit board 18 so as to overlay the electronic components 21 on the upper side 18b of the printed circuit board 18, which electrically shields the electronic components 21 mounted on the upper side 18b.

The printed circuit board 18 is mounted on the case 1 in such a manner that the lower side 18a with the heating components 20 mounted thereon faces the bottom wall 1a of the case 1 to seal the opening 1c, and it is attached to the case 1 by screwing male screws 25 put through the through-holes 22 of the printed circuit board 18 into the female screws 8a provided on the projections 8 of the case 1.

Further, in a state that the printed circuit board 18 is attached to the case 1, the thermal conduction member 10 faces to an area including the heating components 21 on the lower side 18a of the printed circuit board 18, and the tongue pieces 16 of the thermal conduction member 10 are in contact with the surfaces of the heating components 21 mounted on the lower side 18a of the printed circuit board 18.

Further, the case 1 to which the printed circuit board 18 and the thermal conduction member 10 with the sheet 30 glued thereon are attached is mounted on the surface of a mother board 26 where conductive patterns 27 are formed, and it is fastened to the mother board 26 by screwing male screws 29 put through the through-holes 7a formed on the ears 7 of the case 1 into female screws 28 made on the mother board 26.

In the electronic device having the aforementioned construction, during its use, the heat generated by the heating components 20 conducts through the tongue pieces 16 to diffuse into the whole thermal conduction member 10, and the heat radiates to the conductive patterns 27 of the mother board 26 adhered to the sheet 30 through the sheet 30 adhered to the thermal conduction member 10. That is, the heat generated from the heating components 20 emits swiftly to the outside of the case 1 from the thermal conduction member 10 through the sheet 30 and the conductive patterns 27, so that the inner temperature is restricted from increase.

In the foregoing embodiment, the thermal conduction member 10 is provided with the cutout portions 13 in which the clasps 5 of the case 1 are engaged. However, the clasps 5 may be pressed to the front ends of the tongue-form pieces 14 of the thermal conduction member 10 without making the cutout portions 13.

In the electronic device of the invention, the thermal conduction member is in contact with both of the heating components and the conductive patterns on the mother board, and a heat generated in the heating components is swiftly led to the conductive patterns on the mother board through the thermal conduction member, which is diffused from the conductive patterns. Therefore, the temperature increase inside the case is restrained, and the electronic components including the heating components are immune to a performance deterioration accompanied with the temperature increase.

Further, in the electronic device of the invention, the elastic sheet having an excellent thermal conductivity is interposed between the thermal conduction member and the conductive patterns on the mother board. Therefore, the thermal conduction member is adhered to the conductive patterns on the mother board without a gap, which effects a high thermal conductivity between the thermal conduction member and the mother board and a high radiation efficiency of the heat generated by the heating components.

Further, in the electronic device of the invention, the convex parts formed on the case are inserted through the engagement holes provided on the thermal conduction member, and the front ends of the convex parts coming out of the engagement holes are caulked by means of heating or the like. Therefore, the thermal conduction member is fastened to the case without play.

Further, in the electronic device of the invention, since the tongue-form pieces each formed on the parallel sides of the thermal conduction member are hooked by the clasps provided upright on the case, the thermal conduction member is fastened to the case without play.

Furthermore, since the upper sides of the clasps on the case are formed slant, and the tongue-form pieces of the thermal conduction member are easy to deflect in the thickness direction, the work to hook the tongue-form pieces of the thermal conduction member into the clasps can easily be done. Further, since the hooked tongue-form pieces and the clasps are engaged with elasticity, the thermal conduction member can be more securely fastened to the case without play.

What is claimed is:

1. An electronic device comprising: a printed circuit board; heating components mounted on the printed circuit board; a case to which the printed circuit board is attached and in which the heating components are housed; a thermal conduction member made of a metal; and a mother board having conductive patterns formed on the surface thereof, wherein the thermal conduction member is attached to the case in contact with both of the conductive patterns on the mother board and the heating components, and a heat generated from the heating components is conducted to the conductive patterns on the mother board through the thermal conduction member.

2. An electronic device according to claim 1, further comprising an elastic sheet having an excellent thermal conductivity between the thermal conduction member and the conductive patterns on the mother board, wherein the heat generated from the heating components is conducted to the conductive patterns on the mother board through the thermal conduction member and the sheet.

3. An electronic device according to claim 2, wherein the sheet is bonded to a surface of the thermal conduction member, or to a surface of the conductive patterns on the mother board.

4. An electronic device according to claim 1, wherein:

the case is made of a resin, and contains a plurality of convex parts;

the thermal conduction member possesses a plurality of engagement holes into which the convex parts on the case can be inserted; and the convex parts formed on the case are inserted into the engagement holes, and front ends of the convex parts which are projected from the engagement holes are caulked, whereby the thermal conduction member is fastened to the case.

5. An electronic device according to claim 1, wherein the case is made of a resin, on which a pair of clasps resembling L letter are formed upright, and the thermal conduction member is fastened to the case in such a manner that front ends of the thermal conduction member are hooked by the clasps formed on the case.

6. An electronic device according to claim 5, wherein:

the thermal conduction member contains tongue-form pieces between two cutout portions formed on each of two sides parallel to each other of the thermal conduction member;

the upper sides of the clasps formed on the case are slant; and the tongue-form pieces are hooked by the lower sides of the clasps formed on the case.

7. An electronic device according to claim 6, wherein the thermal conduction member contains slits formed along each of the two sides, whereby the tongue-form pieces are made easy to bent in the thickness direction.

* * * * *

UNITED STATES PATENT AND TRADEMARK OFFICE
CERTIFICATE OF CORRECTION

PATENT NO.    : 6,147,866
DATED         : November 14, 2000
INVENTOR(S)   : Yoshio Saito et al.

Page 1 of 1

It is certified that error appears in the above-identified patent and that said Letters Patent is hereby corrected as shown below:

Claim 7,
Line 4, change "bent" to -- bend --.

Signed and Sealed this

Eighteenth Day of December, 2001

Attest:

Attesting Officer

JAMES E. ROGAN
Director of the United States Patent and Trademark Office